(12) United States Patent
Kimura et al.

(10) Patent No.: US 6,642,520 B2
(45) Date of Patent: Nov. 4, 2003

(54) SCANNING ELECTRON MICROSCOPE

(75) Inventors: Kouji Kimura, Tokyo (JP); Hirotami Koike, Tokyo (JP)

(73) Assignee: Kabushiki Kaisha Topcon, Tokyo (JP)

( * ) Notice: Subject to any disclaimer, the term of this patent is extended or adjusted under 35 U.S.C. 154(b) by 0 days.

(21) Appl. No.: 10/209,718

(22) Filed: Aug. 1, 2002

(65) Prior Publication Data

US 2002/0185599 A1 Dec. 12, 2002

Related U.S. Application Data

(63) Continuation-in-part of application No. 09/545,109, filed on Apr. 6, 2000, now abandoned.

(30) Foreign Application Priority Data

Apr. 13, 1999 (JP) ............................................. 11-105135

(51) Int. Cl.⁷ ................................................. H01J 37/26
(52) U.S. Cl. ....................................... 250/310; 250/397
(58) Field of Search ................................ 250/310, 397, 250/398

(56) References Cited

U.S. PATENT DOCUMENTS

| | | | |
|---|---|---|---|
| 4,658,136 A | | 4/1987 | Ohtaka et al. |
| 4,933,552 A | * | 6/1990 | Lee ........................... 250/310 |
| 5,412,210 A | | 5/1995 | Todokoro et al. |
| 5,598,002 A | | 1/1997 | Todokoro et al. |
| 5,872,358 A | | 2/1999 | Todokoro et al. |
| 6,043,491 A | | 3/2000 | Ose et al. |

FOREIGN PATENT DOCUMENTS

| | | |
|---|---|---|
| EP | 0641011 A2 | 3/1995 |
| EP | 0769799 A2 | 4/1997 |
| EP | 0817235 A1 | 1/1998 |

* cited by examiner

*Primary Examiner*—Kiet T. Nguyen
(74) *Attorney, Agent, or Firm*—Haynes and Boone, LLP

(57) ABSTRACT

A scanning electron microscope comprises: an electron beam source, an electron beam acceleration device for accelerating primary electrons generated by the electron beam source, a deflector 5 for scanning and deflecting the accelerated primary electrons, a magnetic-electrostatic compound objective lens 2, 3 for focusing the scanned and deflected primary electrons onto a specimen 4 mounted on a specimen support, a reflection electron detector 10 for detecting reflection electrons generated from the specimen due to focusing and irradiating the primary electrons onto the specimen 4, a secondary electron detector 20 for detecting secondary electrons generated from the specimen due to focusing and irradiating the primary electrons onto the specimen 4, and an image display device for displaying a specimen image from detection signals from each detector 10, 20. Moreover, there is provided an aperture 17 around an axis for passing an electron beam and secondary electrons around the axis through the reflection electron detector 10. This gives a: scanning electron microscope device which can separate and detect on an electron beam axis, reflection electrons and secondary electrons from a specimen, with a device of a simple construction.

6 Claims, 5 Drawing Sheets

SCANNING ELECTRON MICROSCOPE

CROSS-REFERENCE TO RELATED APPLICATIONS

This application is a continuation-in-part of U.S. patent application Ser. No. 09/545,109, now abandoned, filed Apr. 6, 2000, by Kouji Kimura and Hirotami Koike entitled Scanning Electron Microscope, which claims priority to Japanese Patent Application No. 11-105135, filed Apr. 13, 1999, each of which is hereby incorporated herein by reference in its entirety and is assigned to the assignee of this application.

BACKGROUND

1. Technical Field

The present invention relates to a scanning electron microscope device which scans a specimen with a focused electron beam, and detects reflection electrons and secondary electrons generated from the specimen. Then based on detection signals thereof, the device displays a two-dimensional scanning image of the specimen on an image display device such as a cathode ray tube (CRT display device), and measures the surface shape and the like of the specimen at a high definition and high resolution.

2. Description of the Related Art

Conventionally, a scanning electron microscope is used for observing the shape of circuit patterns or contact holes of submicron order, on a specimen such as a semiconductor device of an LSI or the like.

Recently, the integration of semiconductor devices has increased, and the size of circuit patterns and contact holes formed on the specimen has become microscopic, bringing about the requirement for a high resolution scanning electron microscope device for observing these shapes.

As a method of improving the resolution of such a scanning electron microscope device, a lens having a retarding field such as a magnetic-electrostatic compound objective lens comprising an electrostatic lens and a magnetic lens, is used as the objective lens, and aberrations of the objective lens are kept to a minimum by shortening the distance (operating distance) between the tip of the objective lens and the specimen.

With such a device, normally secondary electrons generated from the specimen as a result of a primary electron beam irradiated onto the specimen are detected with a detector to thereby obtain a scanning image. However arranging such a magnetic-electrostatic compound objective lens close to the specimen can cause discharge or the like due to the influence from the retarding field thereof formed close to the specimen. Moreover, there is the possibility of a loss in optical performance due to disturbances occurring in the retarding field caused by the arrangement of the detector.

For this reason, with conventional electron microscope devices, it is necessary to arrange the detector at a location away from the magnetic-electrostatic compound objective lens.

Moreover, in the case of observing in a specimen, the shape of the bottom surface of a contact hole or the like having a large aspect ratio (the size of the depth compared to the width), since the secondary electrons generated from the bottom surface of the contact hole have a low energy, they collide with the inner wall of the contact hole and do not come out from the specimen surface. For this reason observation of the contact hole using secondary electrons is difficult.

Therefore, in observation of such locations, observation is performed using only reflection electrons.

Moreover, with an objective lens having a retarding field such as the abovementioned magnetic-electrostatic compound objective lens, the retarding field formed by the magnetic-electrostatic compound objective lens, so that the energy thereof is increased accelerates the secondary electrons generated from the specimen.

Therefore, with the conventional detection method, the detection becomes even more difficult.

On the other hand, a method is considered such as where as shown in FIG. 6, a Wine filter 6 in which an electric field and magnetic field are combined, is arranged on the optical axis for detecting the reflection electrons and secondary electrons 7 generated from the specimen 4, and only electrons of a specific energy are guided away from the optical axis, and then subjected to an electric potential close to the detector so that the reflection electrons and secondary electrons are attracted to the detector side.

Here numeral 1 denotes a secondary electron detector, 2 denotes an electromagnetic lens, 3 denotes an electrostatic lens, 4 denotes a specimen, and 5 denotes a deflecting coil.

Furthermore, as another conventional method, as shown in FIG. 7, a method is carried out for impinging the secondary electrons 7 accelerated by the abovementioned retarding field onto another target 8, and attracting the secondary electrons generated from this target 8 to a detector 1 side arranged away from the optical axis. In FIG. 7, parts the same as those in FIG. 6 are denoted with the same symbol.

Of the above described methods, with the method which uses the Wien filter 6 (FIG. 6), there is the problem that in consideration of the influence exerted by the Wien filter 6 on the primary electron beam, is also necessary to superimpose an auxiliary electromagnetic field, causing a worsening of aberration.

Moreover, with the latter shown method (FIG. 7) of impinging on a target, there is the problem that the strength of the signals which can be detected is very much smaller compared to the strength of the signals for the case where the secondary electrons generated from the specimen are detected by a direct detector.

Furthermore, in observing the bottom face of the contact hole having a high aspect ratio as mentioned above, a scanning image from reflection electrons is used. However a part of these reflection electrons impinge on the inner wall of the contact hole so that secondary electrons are generated from the inner wall.

Accordingly, with the conventional method, it is difficult to separate the reflection electrons from the secondary electrons. Therefore there is the problem that when observing the bottom face image of the contact hole, the reflection electron image and the secondary electron image are mixed so that the resultant image quality is impaired.

SUMMARY

Therefore, it is an object of the present invention to provide a scanning electron microscope device which can separate and independently detect on an electron beam axis, reflection electrons and secondary electrons from a specimen, and which can obtain a good image, with a device of a simple construction.

As a means of solving these problems, a scanning electron microscope comprises: an electron beam source, an electron beam acceleration device for accelerating primary electrons generated by the electron beam source, a deflector for scanning and deflecting the accelerated primary electrons, a magnetic-electrostatic compound objective lens for focusing the scanned and deflected primary electrons onto a specimen mounted on a specimen support, a reflection electron detector for detecting reflection electrons generated from the specimen due to focusing and irradiating the primary electrons onto the specimen, a secondary electron detector for detecting secondary electrons generated from the specimen due to focusing and irradiating the primary electrons onto the specimen, and an image display device for displaying a specimen image from detection signals from each detector, wherein there is provided an aperture around an axis for passing an electron beam and secondary electrons around the axis through the reflection electron detector.

Moreover, the secondary electron detector is arranged around the axis, and between the reflection electron detector and the electron beam source.

Furthermore, the image display device performs arithmetic processing based on respective signals detected by the secondary electron detector and the reflection electron detector, to thereby form the specimen image.

DESCRIPTION OF THE PREFERRED EMBODIMENTS

Figure 1:
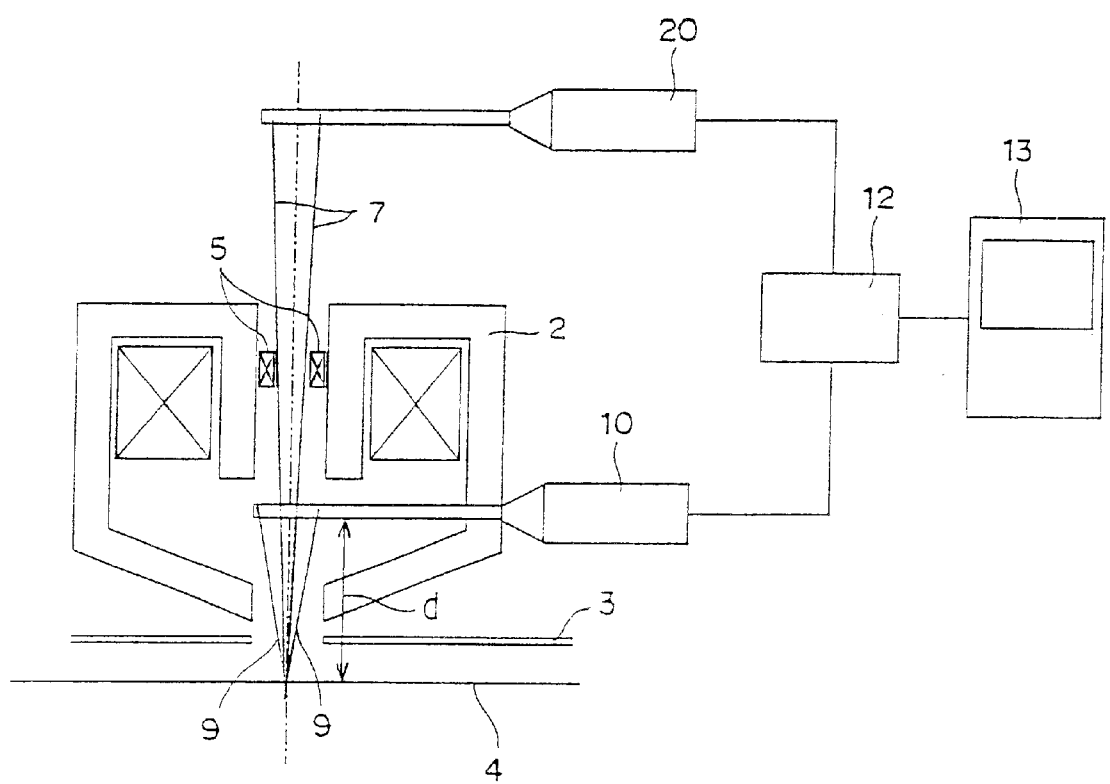
FIG. 1 is a diagram showing an example of a scanning electron microscope device according to the present invention.

Hereunder is a detailed description of embodiments with reference to the drawings. FIG. 1 is a schematic diagram of an example of a scanning electron microscope according to the present invention.

In FIG. 1, numeral 2 denotes an electromagnetic lens being an objective lens, 3 denotes an electrostatic lens being an objective lens, 4 denotes a specimen, 5 denotes a deflecting coil being a deflector, 7 denotes a locus of a secondary electron beam, 9 denotes a locus of a reflection electron beam, 10 denotes a reflection electron detector, 20 denotes a secondary electron detector, 12 denotes a signal processing unit, and 13 denotes a CRT monitor.

Primary electrons generated by an electron gun are accelerated by an electron beam accelerator, and then scan deflected with the deflecting coil 5.

The resultant scan deflected primary electron beam is finely converged onto the surface of the specimen 4 by means of an objective lens comprising a condenser lens (not shown in the figure), the electromagnetic lens 2, and the electrostatic lens 3. The converged electron beam is then scanned on the specimen using the deflecting coil 5. By irradiating and scanning the specimen with the electron beam, reflection electrons and secondary electrons are generated from the specimen. These reflection electrons and secondary electrons fly upward from the specimen 4 while being subjected to the influence of the electromagnetic field produced by the objective lens.

Figure 5:
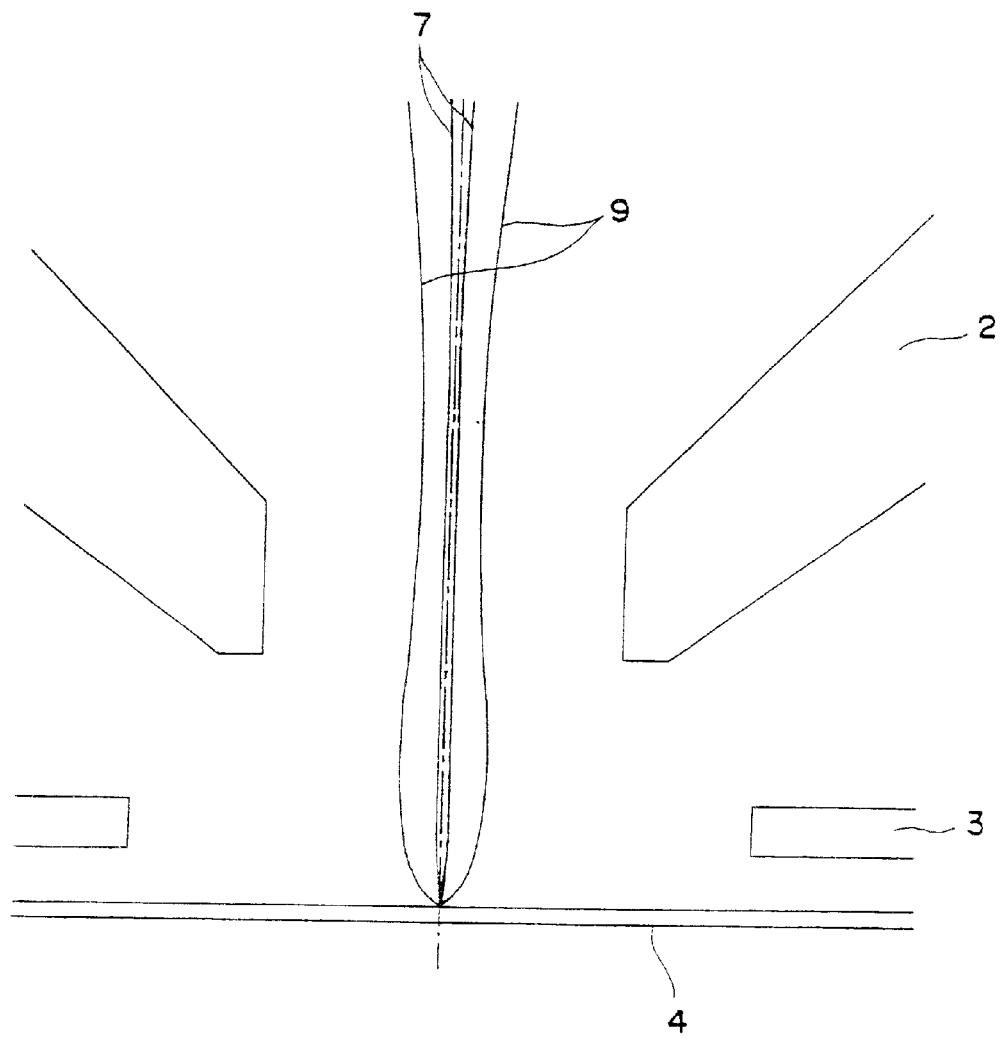
FIG. 5 is a schema of a reflection electron and secondary electron trajectory generated from a specimen.
Figure 6:
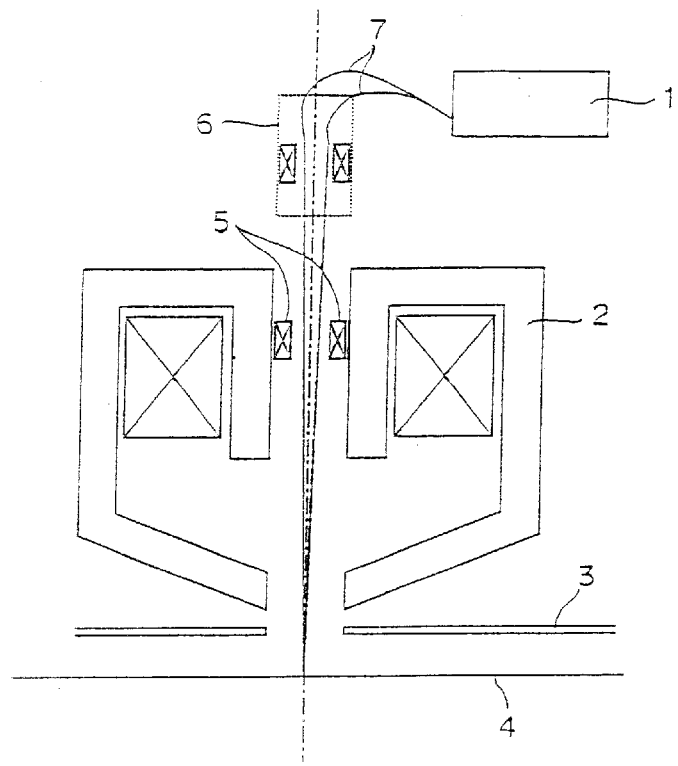
FIG. 6 is a diagram showing an example of a scanning electron microscope which uses a Wien filter, based on conventional technology.
Figure 7:
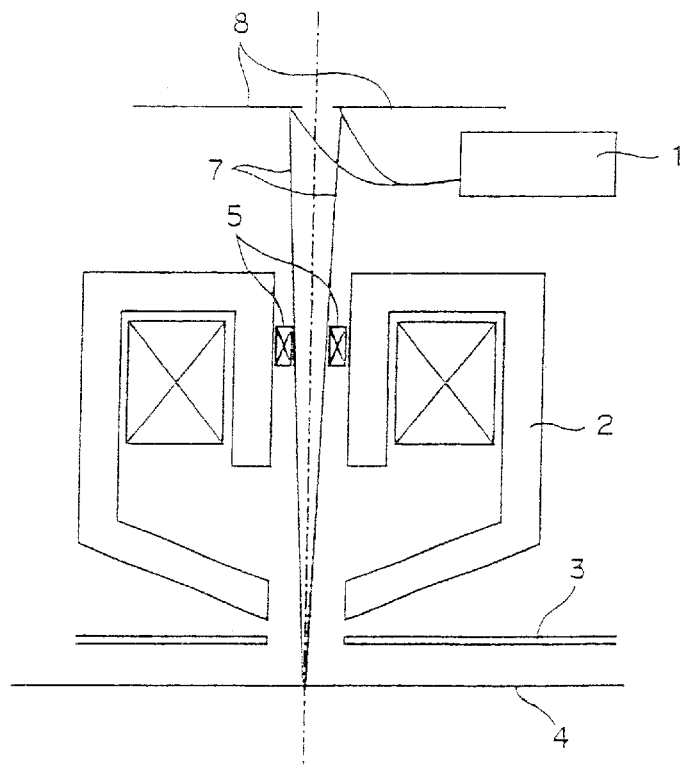
FIG. 7 is a diagram showing a device for detecting secondary electrons, for where secondary electrons generated from a specimen are impinged on a separate target.

In FIG. 5, the trajectory 9 of the reflection electrons and the trajectory 7 of the secondary electrons, generated upwards from the specimen 4 are drawn schematically. The reflection electrons with high energy are hardly influenced by the electromagnetic field due to the objective lens, and proceed on the trajectory 9. However, the secondary electrons with low energy are strongly influenced by the magnetic field due to the objective lens, and hence the trajectory 7 thereof is bent towards the optical axis direction. Therefore the trajectory is drawn as passing close to the optical axis, and this is verified by simulation.

The above mentioned simulation will be described in detail.

With the scanning electron microscope shown in FIG. 1, an electron optical system was formed having a retarding section such as a magnetic-electrostatic compound lens with the electromagnetic lens 2 and the electrostatic lens 3 combined. With this electron optical system, a computer simulation was executed to trace the possible trajectories of the reflection electrons and the secondary electrons discharged from the specimen irradiated by the electron beam.

According to this result, as shown in FIG. 5, it was clarified that the reflected electrons having substantially the same energy as the incident primary electrons are not susceptible to influence from the retarding field, and hence follow a trajectory straight ahead in the discharge direction. On the other hand, the secondary electrons of low energy are strongly influenced by the retarding field, and hence take a trajectory which wraps around the optical axis.

From this result, considering a cross-section of the reflection electron trajectory and the secondary electron trajectory in a plane perpendicular to the optical axis, it was found to be possible to identify a position of a plane where the reflection electron trajectory has intersection points on the plane at locations away from the optical axis, while the secondary electron trajectory has intersection points on the plane at locations close to the optical axis.

Figure 2:
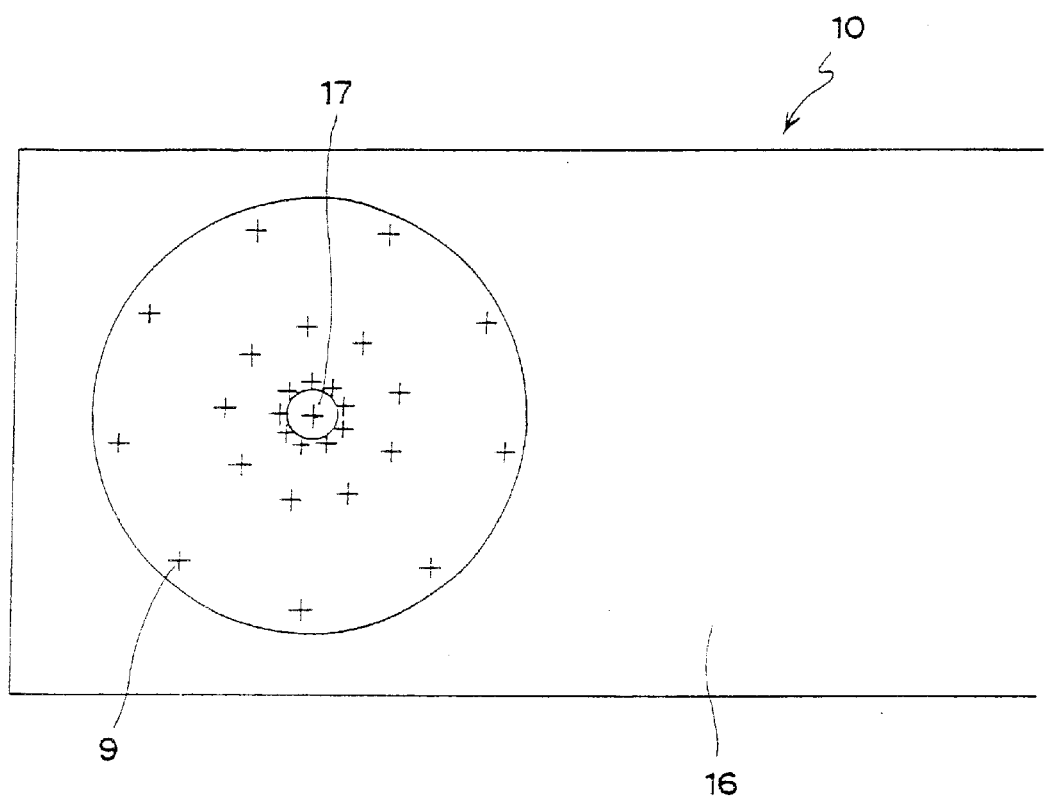
FIG. 2 schematically illustrates trajectories of reflection electrons which are complementary to a reflection electron detector.
Figure 3:
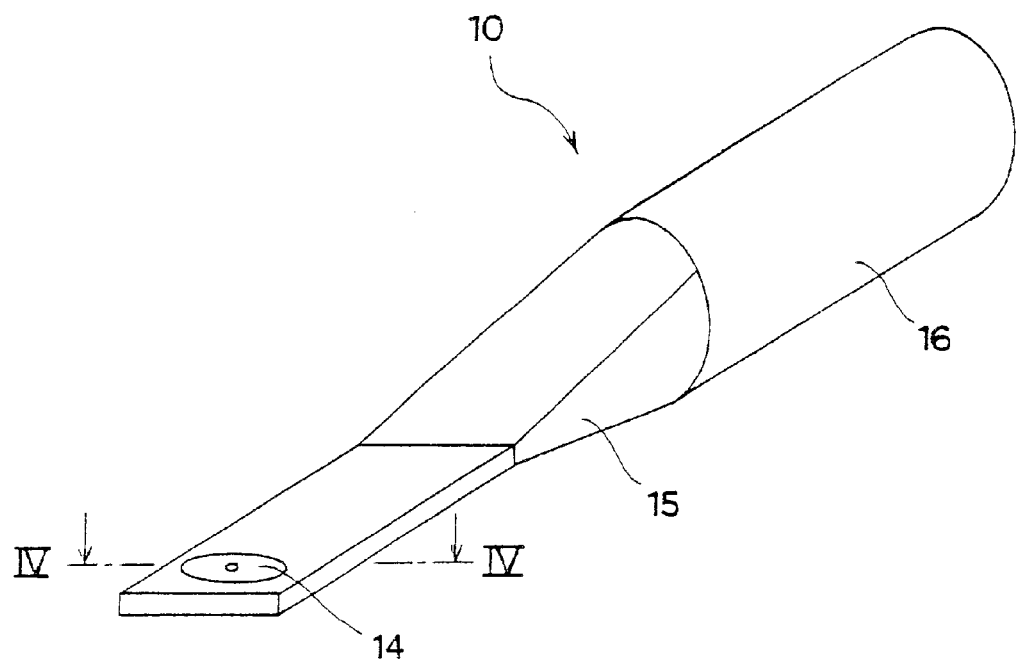
FIG. 3 is a perspective view showing a reflection electron detector used in the present invention.
Figure 4:
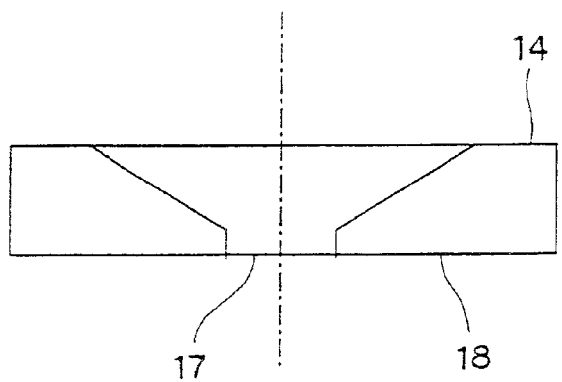
FIG. 4 is an enlarged cross-section view on line IV—IV, of a scintillator portion of the detector shown in FIG. 3.

FIG. 2 schematically shows the case where a detector such as shown in FIG. 3, FIG. 4 and FIG. 5 is positioned on a plane satisfying these conditions, the positions of the reflection electrons impinging on the detector being based on computational results of simulation.

FIG. 3 and FIG. 4 show the reflection electron detector 10. This reflection electron detector 10 is generally used in scanning electron microscopes and comprises: a detection portion 14 comprising a scintillator located at the tip of the detector, a light guide 15, and a PMT (photomultiplier) (not shown in the figure).

A detailed explanation is given as follows. For instance, the simulation is executed under the condition that the prescribed magnetic-electrostatic lens is mounted within the height of less than 30 mm from the specimen position along the optical axis. Then, on a plane of the height of about 50 mm from the specimen position, a secondary electron passing region is a region enclosed by a circle with a diameter of about 2 mm centering the optical axis, and a reflection electron passing region is a region enclosed between the circle with the diameter of about 2 mm and a circle with a diameter of about 7 mm centering the optical axis. Further, on a plane of the height of about 30 mm from the specimen position, the secondary electron passing region is a region enclosed by a circle with a diameter of about 1 mm centering the optical axis, and the reflection electron passing region is a region enclosed between the circle with the diameter of about 1 mm and a circle with a diameter of about 3.6 mm centering the optical axis. According to the computational results of the simulation, the minimum detecting region of the reflection electron, which means the reflection electron passing region whose area is smallest, is located on a plane of the height of about 30 mm from the specimen position.

The detection portion 14 or a detection portion member 18 is formed so as to cover or be equal to the minimum detecting region that is shown as the region enclosed between a large circle and a small circle in FIG. 2, and that depends on a distance (d) from the specimen position to the detection portion 14, a kind of detection signal, and a specification of the magnetic-electrostatic compound objective lens. With this example, an aperture 17 opened at a location of the detection portion 14 corresponding to the electron beam optical axis, sufficiently passes the secondary electron beam, and the detection portion member 18 which can detect reflection electrons from the specimen is provided at the perimeter of the aperture 17.

The arranged position of the reflection electron detector 10, and the size and shape of the aperture 17 provided in the detector 10 are considered to differ depending on the lens shape. Therefore the optimum configuration is determined based on the results of simulation.

The optimum configuration of the reflection electron detector 10 is for example such that this can give the size of the numerical aperture mm, provided at the detector tip.

In this way, the present invention is able to separately detect the reflection electrons and the secondary electrons with the detector arranged on the optical axis, by utilizing the difference between the reflection electron trajectory and the secondary electron trajectory generated from the specimen.

FIG. 2 is a schematic illustration based on the results of simulation, of locations where the reflection electrons impinge on the detector, for the case viewed in the direction of the electron beam optical axis for when the reflection electron detector 10 is located at a position an optional height from the surface of the specimen 4. In FIG. 2, the secondary electrons (not shown in the figure) trace a trajectory through a location close to the optical axis. Therefore these pass through the aperture 17 which is opened at the center of the detector.

In this way, with the reflection electrons and secondary electrons generated from the specimen 4, by finding from the results of simulation, a location on a common axis where these two can be separated, it was verified that the reflection electrons and the secondary electrons can be independently and separately detected on a common axis. Regarding at this time, the size of the aperture 17 of the reflection electron detector 10 located at the tip of the detector, and a distance (d) shown in FIG. 1 from the specimen position of the detector, since these differ depending on the lens configuration, it is necessary to determine these based on simulation results.

This is also the same for the secondary electron detector 20.

Here the structure of the detector and the like shown in FIG. 1, FIG. 2 and FIG. 4 has been shown for convenience of explanation. However this is not limited to the shape shown in the figures.

As described above, with the scanning electron microscope device according to the present invention, the reflection electrons and the secondary electrons generated from the specimen can be effectively separated and detected on the same axis. Hence an improvement in image quality of the secondary electron image can be achieved. Moreover, the effect is obtained in that it becomes possible to clearly observe a bottom face of a contact hole or the like having a large aspect ratio, by means of the reflection electron image.

What is claimed is:

1. A scanning electron microscope comprising:

an electron beam source, electron beam acceleration means for accelerating primary electrons generated by the electron beam source, a deflector for scanning and deflecting the accelerated primary electrons, a magnetic-electrostatic compound objective lens for focusing the scanned and deflected primary electrons onto a specimen mounted on a specimen support, wherein the magnetic-electrostatic compound objective lens has a retarding field and includes a magnetic lens and an electrostatic lens, a reflection electron detector for detecting reflection electrons around an axis by using the retarding field, and having a first detection portion formed so as to cover a first minimum detecting region depending on a distance from the specimen to the first detection portion, a kind of detection signal from the reflection electron detector, and a specification of said magnetic-electrostatic compound objective lens, the reflection electrons being generated from the specimen due to focusing and irradiating the primary electrons onto the specimen, a secondary electron detector for detecting secondary electrons around the axis by using the retarding field, and having a second detection portion formed so as to cover a second minimum detecting region depending on a distance from the specimen to the second detection portion, a kind of detection signal from the secondary electron detector, and a specification of said magnetic-electrostatic compound objective lens, the secondary electrons being generated from the specimen due to focusing and irradiating the primary electrons onto the specimen, and image display means for displaying a specimen image from the detection signals from each detector, wherein there is provided an aperture around the axis for passing an electron beam and secondary electrons around the axis through the reflection electron detector.

2. A scanning electron microscope according to claim 1, wherein the secondary electron detector is arranged around the axis, and between the reflection electron detector and the electron beam source.

3. A scanning electron microscope according to claim 2, wherein the image display means performs arithmetic processing based on respective signals detected by the secondary electron detector and the reflection electron detector, to thereby form the specimen image.

4. A scanning electron microscope according to claim 1, wherein the image display means performs arithmetic processing based on respective signals detected by the secondary electron detector and the reflection electron detector, to thereby form the specimen image.

5. A scanning electron microscope according to claim 1, wherein the magnetic lens is an electromagnetic lens.

6. A scanning electron microscope according to claim 1, wherein the reflection electron detector is arranged between the secondary electron detector and the specimen.

\* \* \* \* \*